US012750946B2

(12) United States Patent
Jeong et al.

(10) Patent No.: US 12,750,946 B2
(45) Date of Patent: Sep. 29, 2026

(54) ELECTRONIC DEVICE

(71) Applicant: KMW INC., Hwaseong-si (KR)

(72) Inventors: Bae Mook Jeong, Suwon-si (KR); Kyo Sung Ji, Hwaseong-si (KR); Seong Min Ahn, Namyangju-si (KR); Chi Back Ryu, Hwaseong-si (KR); Jae Eun Kim, Suwon-si (KR); Seung Min Lee, Suwon-si (KR); Ki Hun Park, Hwaseong-si (KR); Won Jun Park, Yongin-si (KR); Jun Woo Yang, Hwaseong-si (KR)

(73) Assignee: KMW INC., Hwaseong-si (KR)

( * ) Notice: Subject to any disclaimer, the term of this patent is extended or adjusted under 35 U.S.C. 154(b) by 189 days.

(21) Appl. No.: 18/525,872

(22) Filed: Dec. 1, 2023

(65) Prior Publication Data

US 2024/0098880 A1 Mar. 21, 2024

Related U.S. Application Data

(63) Continuation of application No. PCT/KR2022/007554, filed on May 27, 2022.

(30) Foreign Application Priority Data

Jun. 1, 2021 (KR) ........................ 10-2021-0070796
May 27, 2022 (KR) ........................ 10-2022-0065241

(51) Int. Cl.

*H05K 1/02* (2006.01)
*H05K 1/184* (2026.01)
*H05K 3/321* (2026.01)

(52) U.S. Cl.

CPC ........... *H05K 1/0212* (2013.01); *H05K 1/184* (2013.01); *H05K 3/321* (2013.01);
(Continued)

(58) Field of Classification Search

CPC ................. H05K 1/0204; H05K 1/184; H05K 2201/066; H05K 2201/064; H05K 1/021
See application file for complete search history.

(56) References Cited

U.S. PATENT DOCUMENTS 5,444,296 A * 8/1995 Kaul ........................ H01L 25/18
257/723
5,583,377 A * 12/1996 Higgins, III ........ H01L 23/3675
257/E23.125
(Continued)

FOREIGN PATENT DOCUMENTS

CN 202841805 U 3/2013
CN 106455461 A 2/2017
(Continued)

OTHER PUBLICATIONS

Japanese Office Action mailed on Feb. 4, 2025 from Japanese Patent Office for Application No. 2023-573398.
(Continued)

*Primary Examiner* — Jeremy C Norris

(57) ABSTRACT

The present disclosure relates to an electronic device, and more specifically, to an electronic device including a printed circuit board including a heat-generating element arranged on one surface thereof, and a heat transfer coin provided such that one surface of the heat transfer coin comes into contact with a portion of the other surface of the printed circuit board, opposite to the heat-generating element, so as to dissipate heat generated from the heat-generating element. Accordingly, the present disclosure provides an advantage of improving heat dissipation performance without increasing the thickness of the printed circuit board.

11 Claims, 17 Drawing Sheets

(52) U.S. Cl.
CPC . *H05K 2201/0355* (2013.01); *H05K 2201/06* (2013.01); *H05K 2201/0715* (2013.01); *H05K 2201/10409* (2013.01)

(56) References Cited

U.S. PATENT DOCUMENTS

| | | | | |
|---|---|---|---|---|
| 2013/0193463 | A1* | 8/2013 | Kong | H10H 20/8582 438/28 |
| 2014/0137410 | A1 | 5/2014 | Wu | |
| 2020/0404803 | A1* | 12/2020 | Uchida | H05K 1/0204 |
| 2021/0105891 | A1 | 4/2021 | Uchida et al. | |

FOREIGN PATENT DOCUMENTS

| | | | |
|---|---|---|---|
| CN | 112399772 | A | 2/2021 |
| EP | 1377142 | A2 | 1/2004 |
| JP | S63-69298 | A | 3/1988 |
| JP | H06-69389 | A | 3/1994 |
| JP | H07-86717 | A | 3/1995 |
| JP | 2001-111270 | A | 4/2001 |
| JP | 2002290091 | A | 10/2002 |
| JP | 2004-140160 | A | 5/2004 |
| JP | 4469101 | B2 | 5/2010 |
| JP | 2017-055616 | A | 3/2017 |
| JP | 2019-216160 | A | 12/2019 |
| KR | 10-2020-0049620 | A | 5/2020 |
| KR | 10-2020-0130406 | A | 11/2020 |
| KR | 10-2021-0033923 | A | 3/2021 |

OTHER PUBLICATIONS

European Search Report mailed on Apr. 25, 2025 from European Patent Office for Application No. 22816395.2.

International Search Report mailed Sep. 1, 2022 for International Application No. PCT/KR2022/007554 and its English translation.

Korean Office Action mailed on Oct. 24, 2025 from Ministry of Intellectual Property for Application No. 10-2022-0065241.

Chinese Office Action mailed on May 28, 2026 from State Intellectual Property Office for Chinese Application No. 202280038925.8 and its English translation.

* cited by examiner (a)

(b)

ELECTRONIC DEVICE

CROSS-REFERENCE TO RELATED APPLICATIONS

This application is a continuation application of International Application No. PCT/KR2022/007554, filed May 27, 2022, which claims the benefit of Korean Patent Application Nos. 10-2021-0070796, filed Jun. 1, 2021; and 10-2022-0065241, filed May 27, 2022, in the Korean Intellectual Property Office, the disclosures of which are incorporated herein in their entirety by reference.

TECHNICAL FIELD

The present disclosure relates to an electronic device, and more specifically, to an electronic device including a heat dissipation unit capable of improving heat dissipation performance on an opposite surface of a printed circuit board on which a heat-generating element is mounted while preventing limitations in a pattern circuit design of the printed circuit board.

BACKGROUND ART

FIG. 1 is a cross-sectional view showing various heat dissipation aspects of a printed circuit board according to the related art.

In general, an electronic device includes a printed circuit board (PCB) 1000, and as shown in FIG. 1, the printed circuit board 1000 is formed by stacking a plurality of raw materials in a multilayer, a predetermined pattern circuit P may be printed on each layer, and a layer bridge B for electrically connecting respective layers may be provided in the form of a hole.

One surface of the printed circuit board 1000 may be provided with at least one heat-generating element Tr that is driven by supplied power and emits a predetermined amount of heat. When the heat emitted from the heat-generating element Tr is not quickly dissipated to the outside, the inherent performance of the electronic device may be deteriorated. In particular, as shown in FIG. 1, when the heat is required to be dissipated in an opposite direction (for example, to the rear side) of the printed circuit board 1000 on which the heat-generating element Tr is mounted, the heat may be dissipated to the rear side through a metal housing 3000 provided on the rear side via a heat transfer coin 2100 made of copper.

In this case, as shown in FIG. 1, since the heat transfer coin 2100 is inserted into the rear side of the printed circuit board 1000 in an embedded form so that a front end surface thereof is in thermal contact with the heat-generating element Tr and a rear end surface thereof is in thermal contact with the metal housing 3000, the heat is dissipated through heat conduction.

However, in order for the heat transfer coin 2100 to be inserted and installed in a completely embedded form, the printed circuit board 1000 needs to be manufactured to have a large thickness of at least 2.5 mm as shown in (A) of FIG. 1, and as shown in (B) of FIG. 1, when the printed circuit board 1000 is manufactured to have a small thickness of 1.6 mm, a part of the heat transfer coin 2100 protrudes rearward. Accordingly, an inner surface of the metal housing 3000 needs to be grooved in order to make surface thermal contact with the metal housing 3000.

Since the thickness of the printed circuit board 1000 needs to be 2.5 mm or more, there is a problem in that design to dissipate heat transmitted through the printed circuit board 1000 the rear side is difficult.

DISCLOSURE

Technical Problem

The present disclosure is directed to providing an electronic device capable of removing limitations in a thickness of a printed circuit board by removing a process of inserting a heat transfer coin into the printed circuit board, and improving heat dissipation performance.

Objects of the present disclosure are not limited to the above-described objects, and other objects that are not mentioned will be able to be clearly understood by those skilled in the art from the following description.

Technical Solution

In order to achieve the objects, an electronic device according to the present disclosure includes a printed circuit board including a heat-generating element arranged on one surface of the printed circuit board; and a heat transfer coin provided such that one surface of the heat transfer coin comes into contact with a portion of the other surface of the printed circuit board, opposite to the heat-generating element, so as to dissipate heat generated from the heat-generating element.

The printed circuit board may be formed with an element mounting hole through which the heat-generating element passes, and the heat transfer coin may cover the element mounting hole, the one surface being in contact with a heat-generating surface of the heat-generating element.

The heat transfer coin may be made of copper or brass.

The electronic device according to the present disclosure may further include a heat pipe having a straight line shape and including one end in contact with the other surface of the heat transfer coin and the other end protruding outward in a direction parallel to the other surface of the printed circuit board.

The heat transfer coin may be formed with a heat-generating surface receiving groove for accommodating a part of an end including the heat-generating surface of the heat-generating element.

The heat transfer coin may be surface-adhered to the other surface of the printed circuit board by using a conductive adhesive.

The heat transfer coin may be closely coupled to the other surface of the printed circuit board by using an assembly screw passing through the printed circuit board.

The electronic device according to the present disclosure may further include a shield cover that covers the one surface of the printed circuit board to prevent leakage of signals generated from the heat-generating element, and the heat transfer coin may be closely coupled to the other surface of the printed circuit board by using an assembly screw passing through the shield cover and the printed circuit board.

The printed circuit board may be formed in a multilayer and may have a thickness of 1.6 mm or less.

The printed circuit board may include a plurality of sections divided in a direction parallel to the one surface of the printed circuit board by a plating part that forms a circuit printed on the one surface of the printed circuit board. The element mounting hole may be formed in the plurality of sections one by one to be formed as a plurality of element mounting holes. The heat-generating element may be formed as a plurality of heat-generating elements passing through the plurality of element mounting holes, respectively. The heat transfer coin may be formed as a plurality of heat transfer coins each having one surface with which a heat-generating surface of each of the plurality of heat-generating elements comes into contact.

An electronic device according to the present disclosure includes a metal housing having an installation space therein, a printed circuit board stacked on an inner surface of the metal housing and including a heat-generating element arranged on one surface of the printed circuit board, and a heat transfer coin provided such that one surface of the heat transfer coin comes into contact with a portion of the other surface of the printed circuit board, opposite to the heat-generating element, so as to dissipate heat generated from the heat-generating element.

An inner surface of the metal housing may be formed with a seating groove into which the heat transfer coin is completely inserted.

The heat transfer coin may be closely coupled to the other surface of the printed circuit board by a board assembly screw fastened to a board screw fastening hole provided on an inner surface of the metal housing by passing through the printed circuit board.

Specific details of other embodiments are included in the detailed description and drawings.

Advantageous Effects

An electronic device according to the present disclosure can achieve the following various effects.

First, the present disclosure has the effect of removing the need for additional processes such as groove processing on a printed circuit board in order to install a heat dissipation unit including a heat transfer coin on the printed circuit board.

Second, the present disclosure has no need to adopt a printed circuit board with specifications having a predetermined thickness or more, and has the effect of improving heat dissipation performance in that heat can be dissipated on both sides of the printed circuit board because a printed circuit board with a small thickness can be adopted.

Effects of the present disclosure are not limited to the above-described effects, and other effects that are not mentioned will be able to be clearly understood by those skilled in the art from the following description.

DESCRIPTION OF REFERENCE NUMERALS

Figure 1:
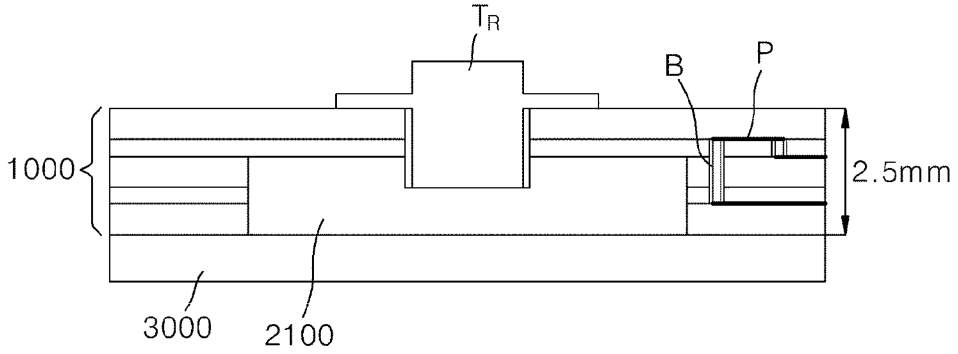
FIG. 1 is a cross-sectional view showing various heat dissipation aspects of a printed circuit board according to the related art.
Figure 1:
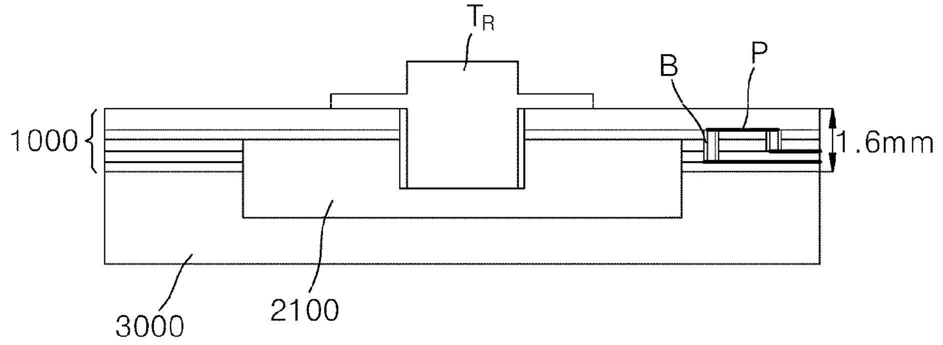

1, 1*a*: Electronic device 310: Metal housing
5*s*: Installation space 5*h*: Board screw through hole
10: Printed circuit board 15: Element mounting hole
20, 21: Heat-generating element 100 Shield cover
210, 220: Heat transfer coin 230 Heat pipe

MODE FOR INVENTION

Hereinafter, an electronic device according to an embodiment of the present disclosure will be described in detail with reference to the accompanying drawings.

It is to be noted that in assigning reference numerals to elements in the drawings, the same reference numerals denote the same elements throughout the drawings even in cases where the elements are shown in different drawings. Furthermore, in describing the embodiments of the present disclosure, a detailed description of the known configurations or functions will be omitted if it is deemed to obscure the understanding for the embodiments of the present disclosure.

In describing the elements of the embodiments the present disclosure, terms, such as the first, the second, A, B, (a), and (b) may be used. However, the terms are used only to distinguish one element from the other element, and the essence, order, or sequence of the elements is not limited by the terms. Furthermore, unless otherwise defined, all terms used herein including technical or scientific terms have the same meanings as the terms generally understood by those skilled in the art to which the present disclosure pertains. The terms, such as terms defined in dictionaries, which are generally used, should be interpreted as having meanings identical to contextual meanings of the related art, and are not interpreted as ideal or excessively formal meanings unless they are definitely defined in the present disclosure.

Figure 2A:
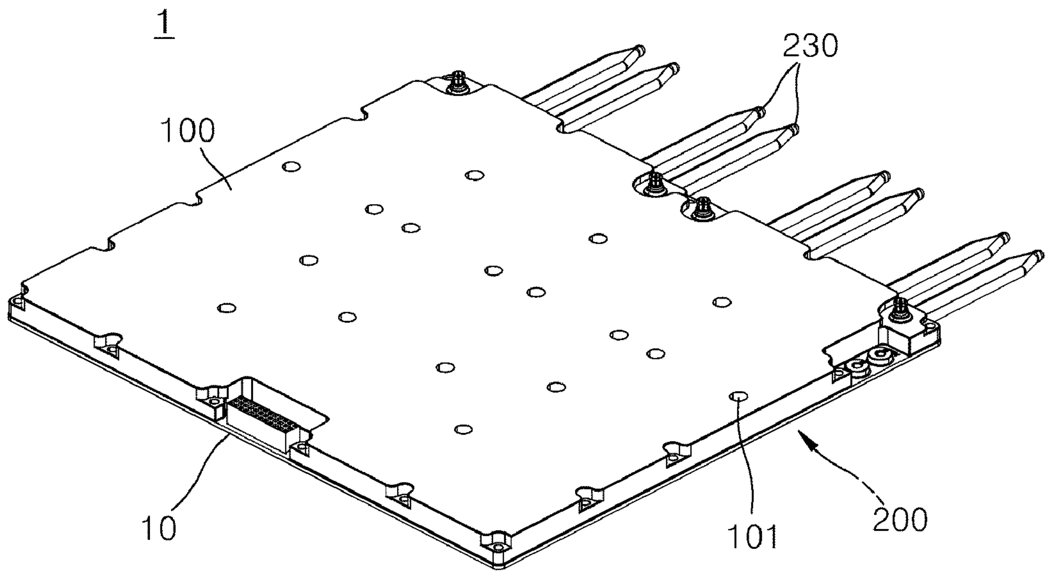
FIGS. 2A and 2B are perspective views showing an electronic device according to an embodiment of the present disclosure.
Figure 2B:
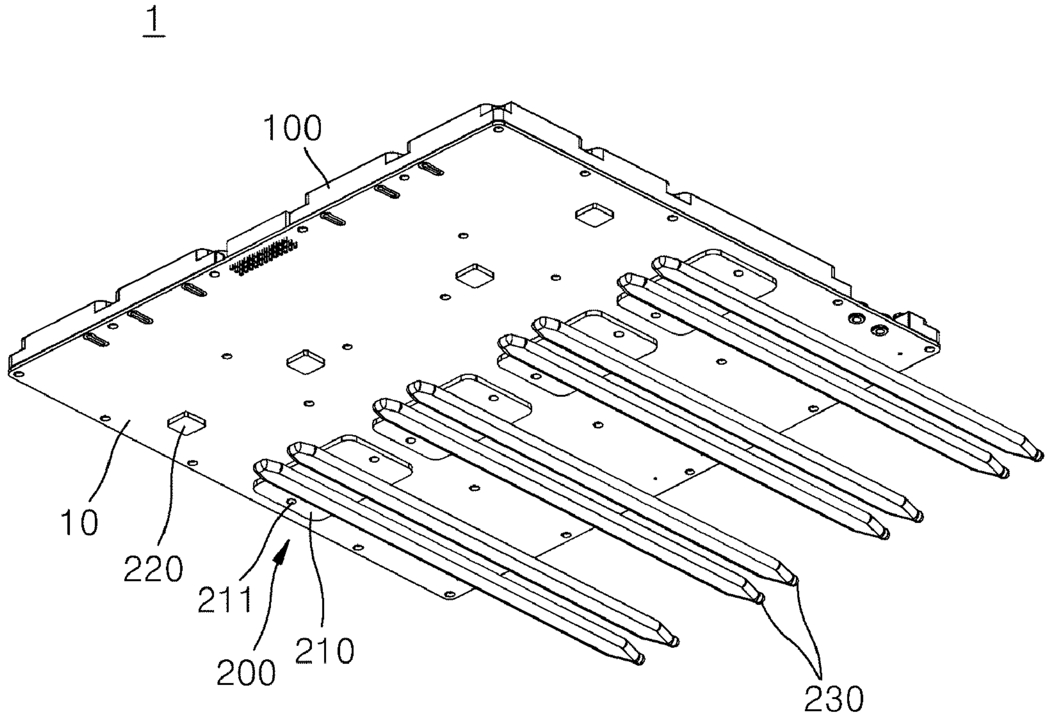
Figure 3A:
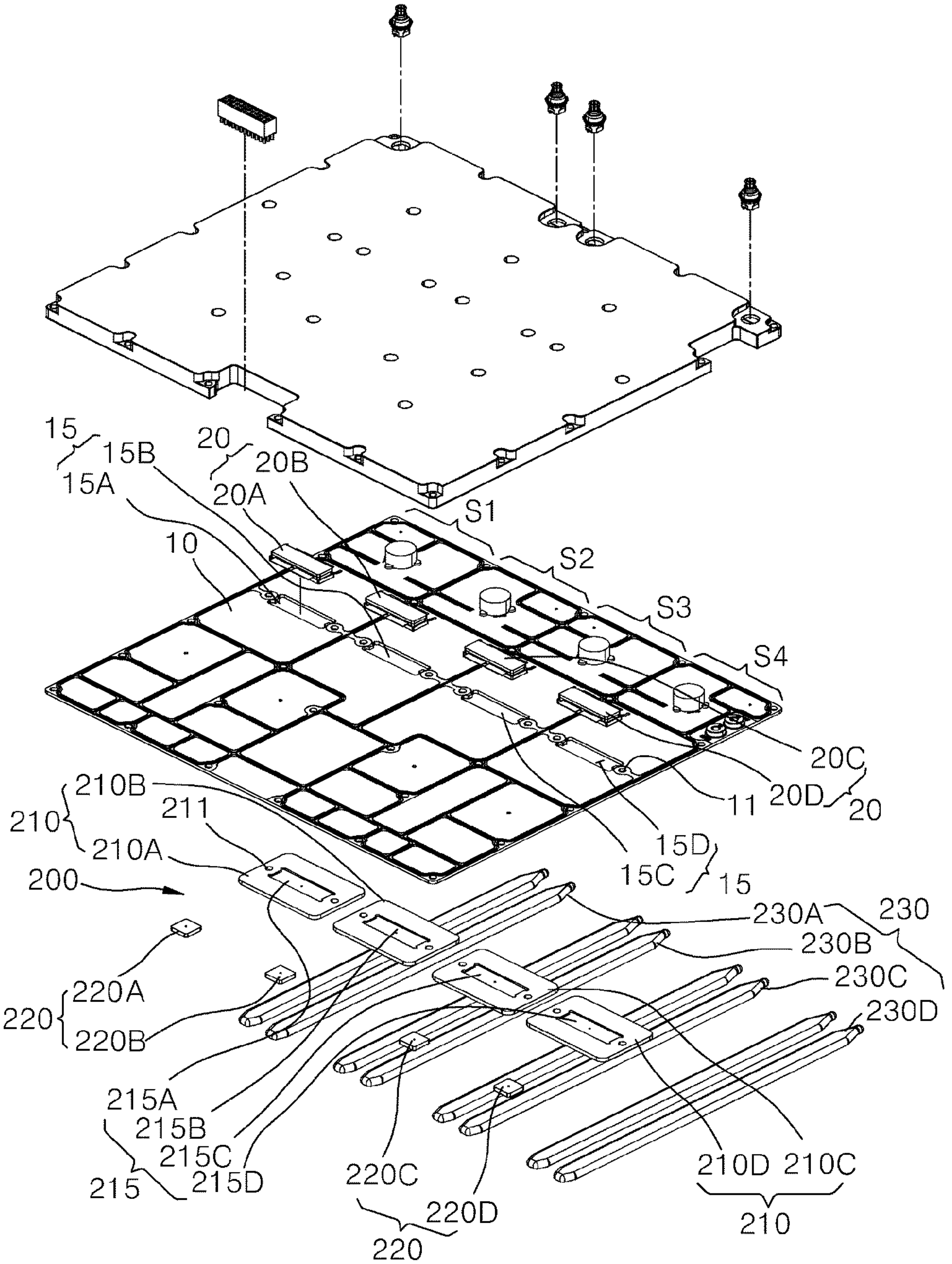
FIGS. 3A and 3B are exploded perspective views of FIGS. 2A and 2B, respectively.
Figure 3B:
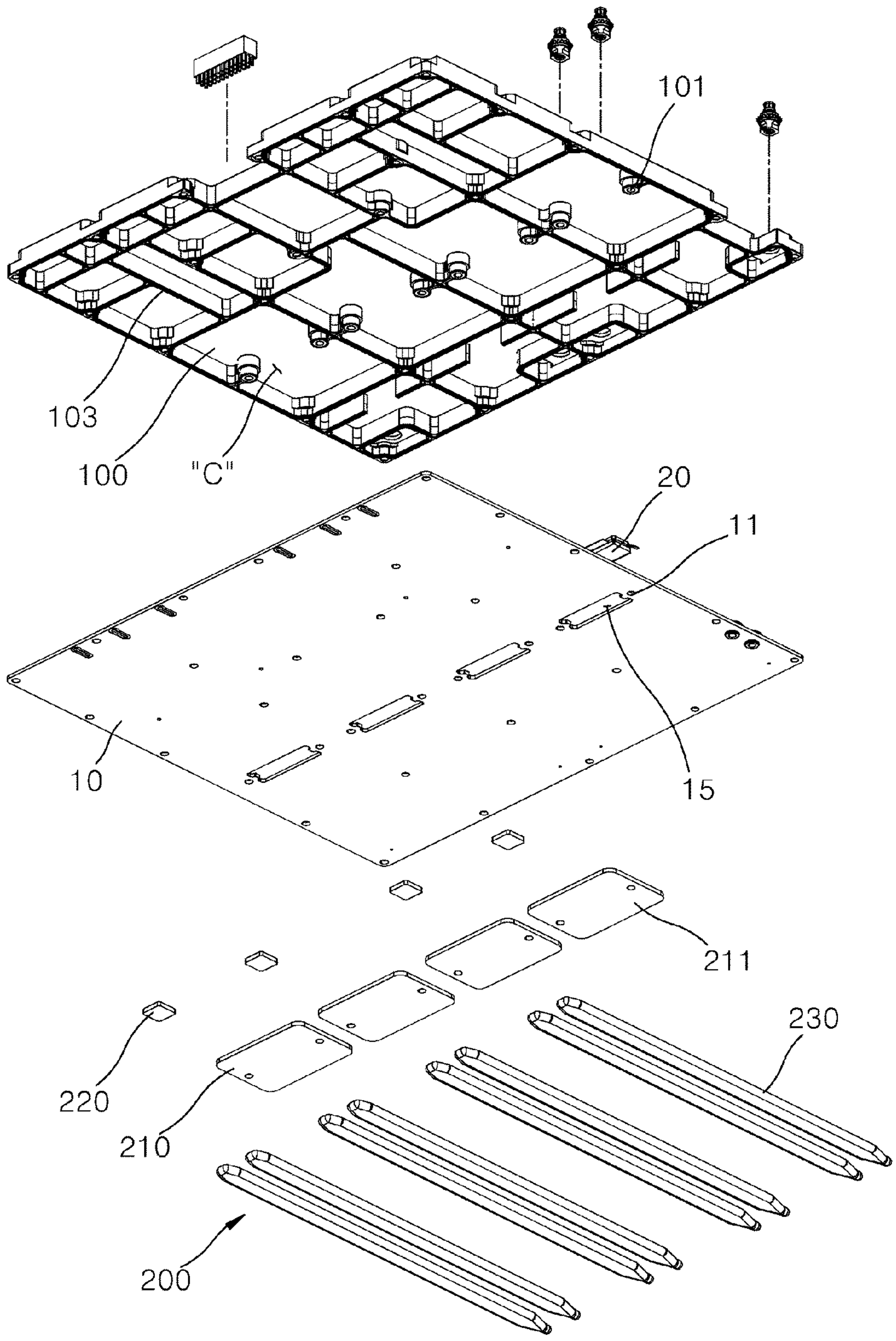
Figure 4:
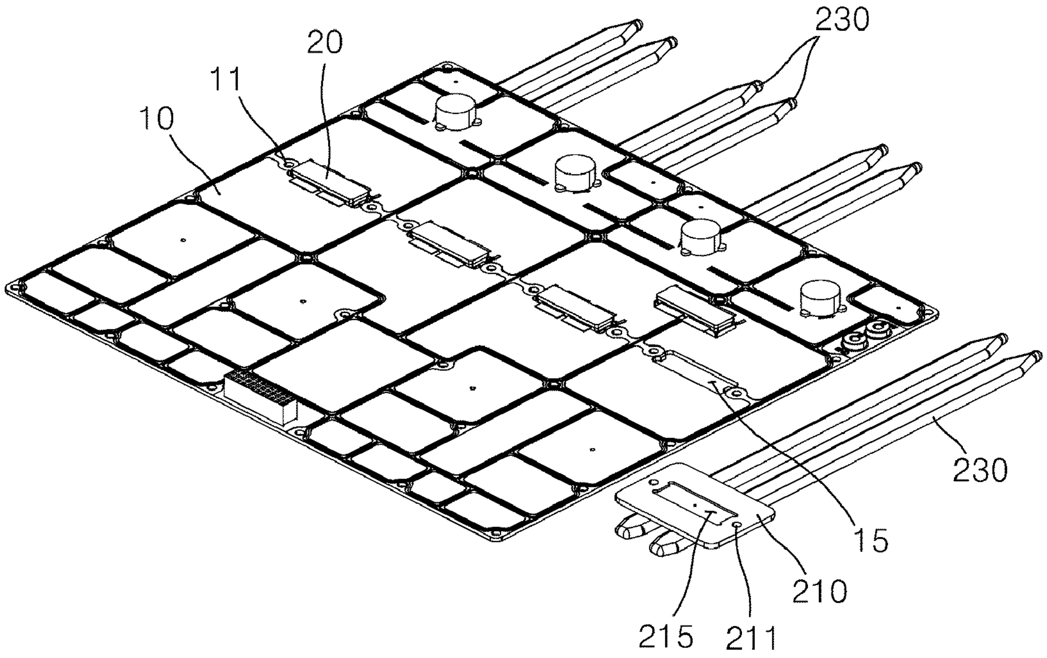
FIG. 4 is an exploded perspective view showing the installation aspect of a heat dissipation unit in FIGS. 2A and 2B.
Figure 5:
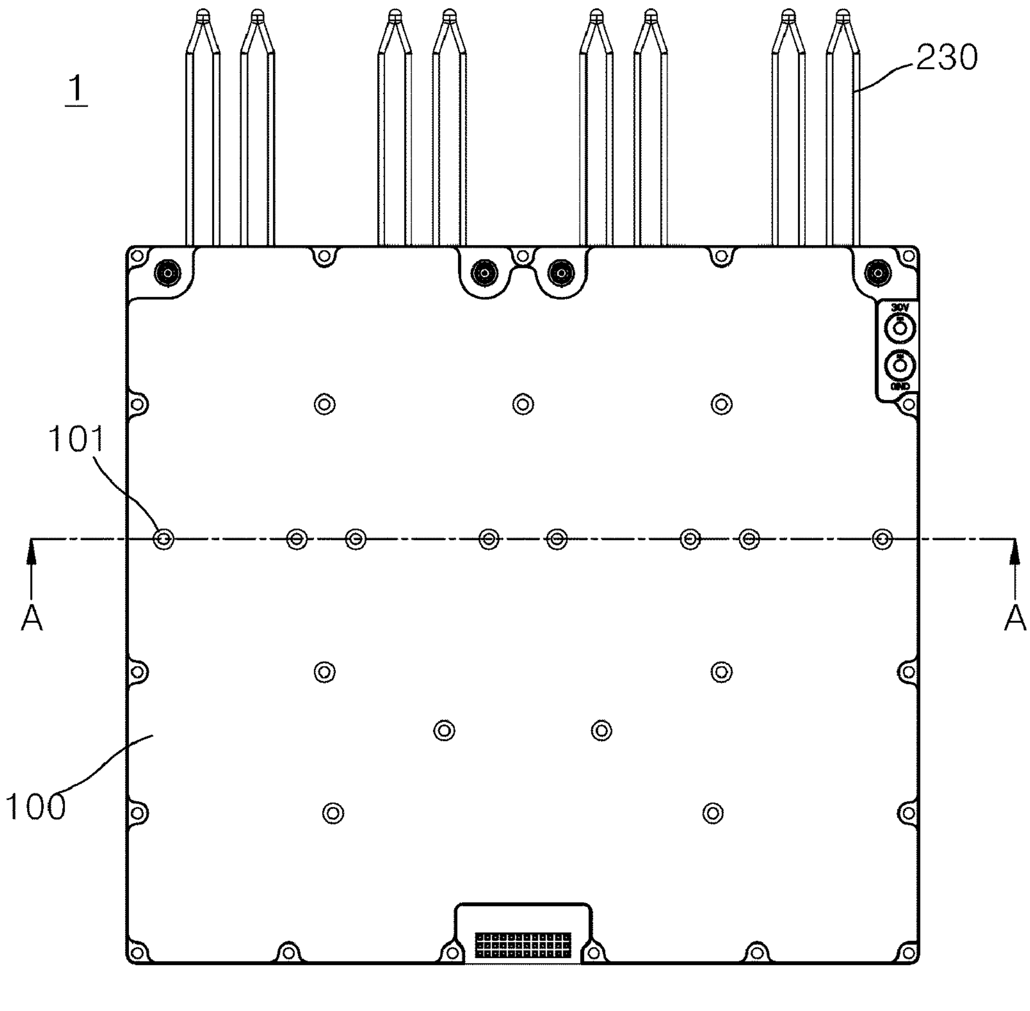
FIG. 5 is a plan view of FIGS. 2A and 2B.
Figure 6:
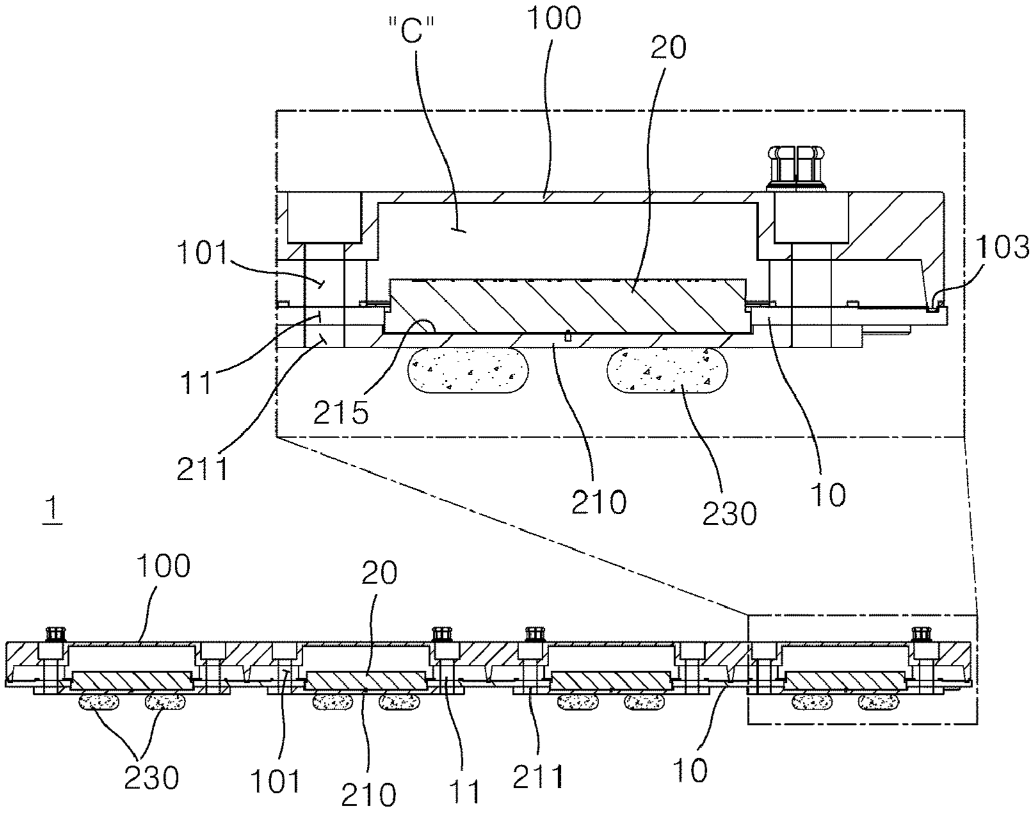
FIG. 6 is a cross-sectional view taken along line A-A in FIG. 5.
Figure 7A:
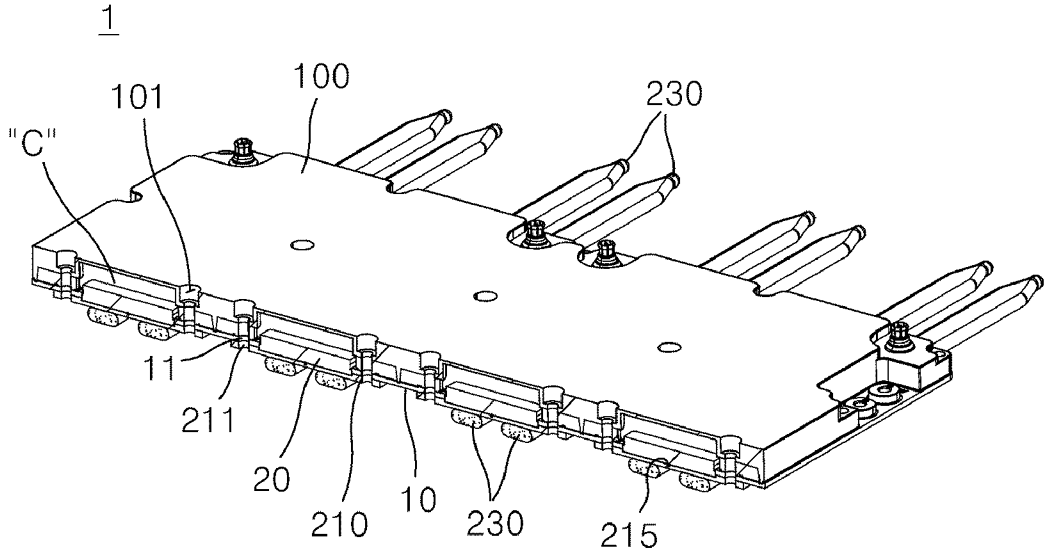
FIGS. 7A and 7B are cut-away perspective views taken along line A-A in FIG. 5.
Figure 7B:
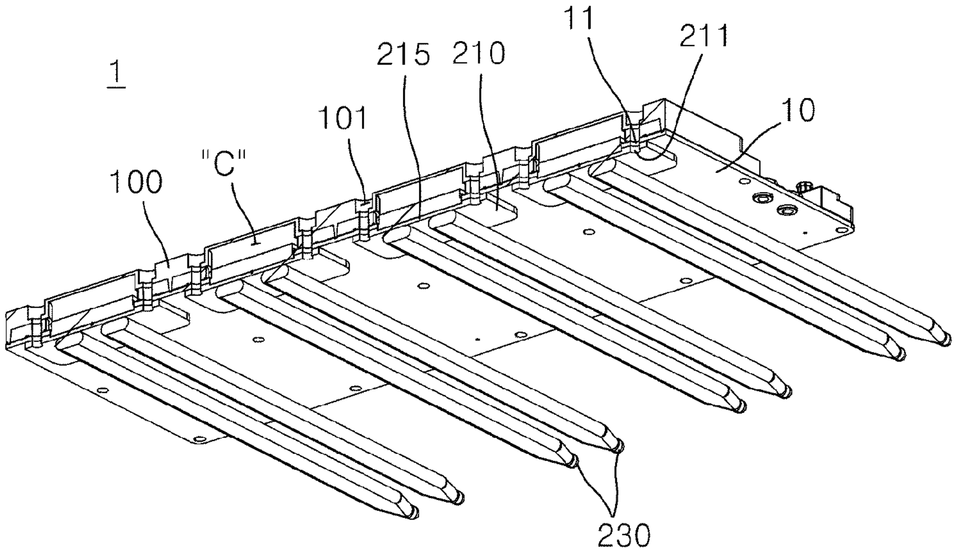

FIGS. 2A and 2B are perspective views showing an electronic device according to an embodiment of the present disclosure, FIG. 3A and FIG. 3B are exploded perspective views of FIGS. 2A and 2B, respectively, FIG. 4 is an exploded perspective view showing the installation aspect of a heat dissipation unit in FIGS. 2A and 2B, FIG. 5 is a plan view of FIGS. 2A and 2B, FIG. 6 is a cross-sectional view taken along line A-A in FIG. 5, and FIGS. 7A and 7B are cut-away perspective views taken along line A-A in FIG. 5.

In the following description, one surface may refer to an upper surface in the drawing, the other surface may refer to a lower surface in the drawing, and the other side may refer to a lower side in the drawing.

As shown in FIGS. 2A, 2B, 3A, 3B, 4, 5, 6, 7A, and 7B, an electronic device 1 according to an embodiment of the present disclosure includes a printed circuit board 10, at least one heat-generating element 20 mounted on the printed circuit board 10, and a heat dissipation unit 200 provided to dissipate heat generated from the heat generating element 20 to the outside.

Although not shown in the drawings, in the printed circuit board 10, a plurality of raw material boards may be stacked to form a multilayer, a pattern circuit may be printed on each layer, and a via hole for electrically connecting the pattern circuits of the respective layers may be formed by plating.

As shown in FIGS. 3A and 3B, the printed circuit board 10 may be formed with at least one element mounting hole 15 which a heat-generating surface of the aforementioned at least one heat-generating element 20 passes through so that the heat-generating surface protrudes to the other surface side of the printed circuit board.

The at least one heat-generating element 20 may be inserted into the element mounting hole 15 from one surface side of the printed circuit board 10 so that a mounting piece (not shown) is mounted on one surface of the printed circuit board 10 and the heat-generating surface protrudes toward the other surface side of the printed circuit board 10. That is, the heat-generating surface of the heat-generating element 20 may protrude further outward than at least the other surface of the printed circuit board 10.

The at least one heat-generating element 20 is a type of electrical element that generates a predetermined amount of heat while operating when power is supplied. For example, in the embodiment of the present disclosure, when the electronic device 1 is an antenna device, the heat-generating surface may be any one of Rx and Tx elements responsible for output and transmission of signals.

As shown in FIG. 4, the heat dissipation unit 200 may be defined as a configuration that performs a function of dissipating driving heat generated from the heat-generating element 20 or heat of the printed circuit board 10 to the other surface side of the printed circuit board 10.

As shown in FIGS. 2A, 2B, 3A, 3B, 4, 5, 6, 7A, and 7B, the heat dissipation unit 200 may include heat transfer coins 210 and 220 each made of copper or brass and a heat pipe 230 that receives heat from the heat transfer coin 210 and thermally conducts the heat to a predetermined position.

Figure 9A:
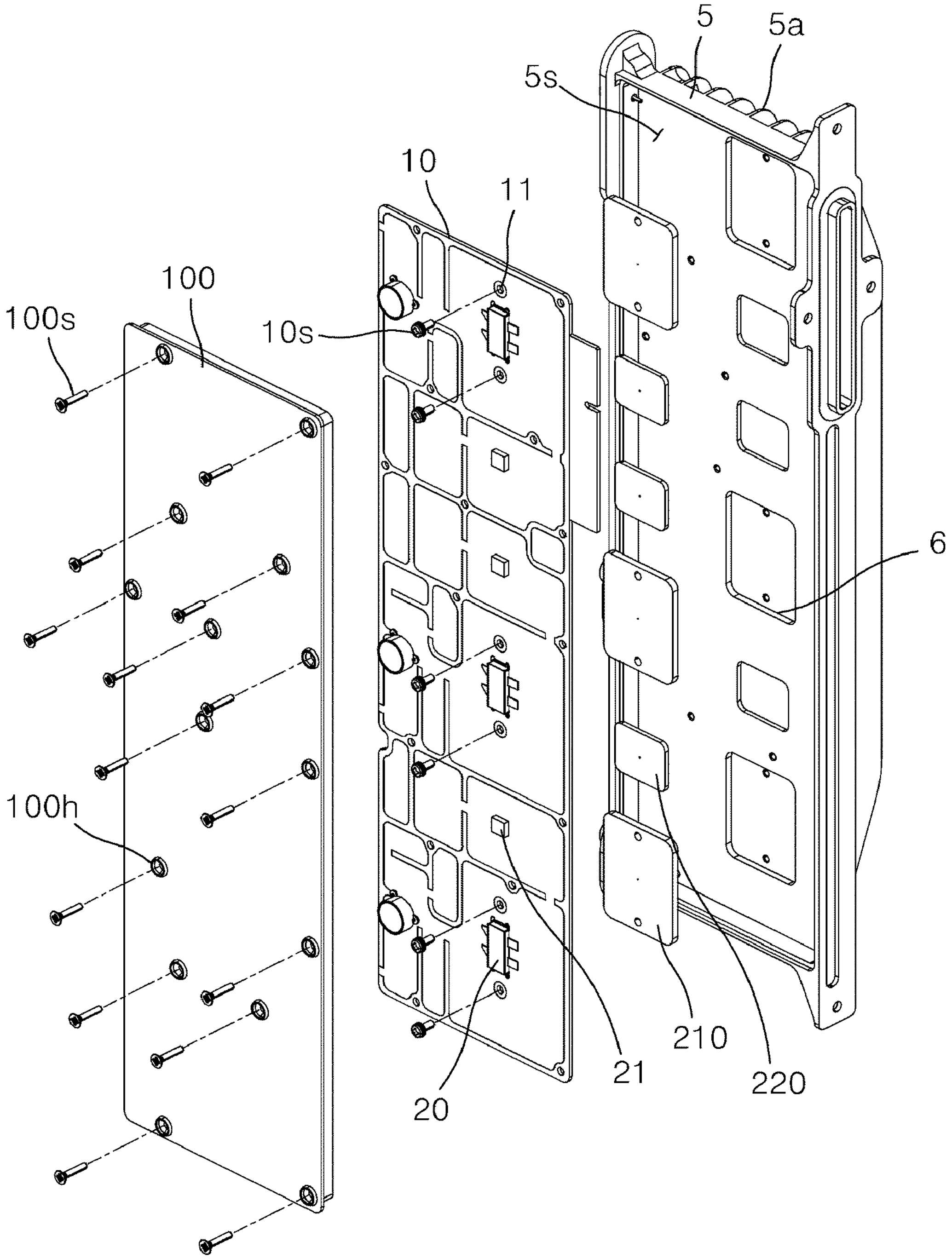
FIGS. 9A and 9B are exploded perspective views of FIGS. 8A and 8B, respectively.

The heat-generating element 20 may include a first heat-generating element 20 that generates a relatively large amount of heat, and a second heat-generating element that generates a relatively small amount of heat (not shown, see reference numeral 21 in FIG. 9A). The first heat-generating element 20 may be arranged on the one surface of the printed circuit board 10 to protrude, and may pass through the element through hole 15. The second heat-generating element may be installed on the one surface of the printed circuit board 10 and protrude from the one surface of the printed circuit board 10.

The heat transfer coins 210 and 220 may include a first heat transfer coin 210 that receives heat from the first heat-generating element 20, and a second heat transfer coin 220 that receives heat from the second heat-generating element (not shown).

The heat-generating element 20 may be arranged on the one surface of the printed circuit board 10 to protrude, and the heat transfer coins 210 and 220 may each be provided such that one surface thereof comes into contact with a portion of the other surface of the printed circuit board 10, opposite to the heat-generating element 20. The opposite side of the heat-generating element 20 may refer to an opposite part corresponding to the one surface on which the heat-generating element 20 is arranged, and the one surface of each of the heat transfer coins 210 and 220 may come into contact with a portion of the other surface of the printed circuit board 10 corresponding to the one surface on which the heat-generating element 20 is arranged.

The heat transfer coins 210 and 220 may each be made of a metal material with excellent heat dissipation performance. In the present embodiment, the heat transfer coins 210 and 220 may each be arranged so that the one surface thereof comes into contact with the other surface of the printed circuit board 10. The one surface of the first heat transfer coin 210 may be arranged on the other surface of the printed circuit board 10 to cover the element mounting hole 15.

The heat transfer coins 210 and 220 are each formed in a rectangular plate shape in the present embodiment, but do not necessarily have to be formed in a rectangular plate shape, and may be formed in at least one plate shape of a circular plate and a polygonal plate (triangular plate, pentagonal plate, hexagonal plate, or the like).

The heat pipe 230 may directly receive heat from one (the first heat transfer coin 210) of the heat transfer coins 210 and 220 in consideration of the amount of heat generation of the heat transfer coins 210 and 220. Although not shown in the drawings, the heat pipe 230 may be connected to both the heat transfer coins 210 and 220 to receive heat. Hereinafter, the heat pipe 230 will be described focusing on an example in which the heat pipe 230 is connected only to the first heat transfer coin 210 out of the first heat transfer coin 210 and the second heat transfer coin 220.

A heat-generating surface of the first heat-generating element 20 may be arranged in contact with the one surface of the first heat transfer coin 210, and one end of the heat pipe 230 may be arranged in contact with the other surface of the first heat transfer coin 210. The other end of the heat pipe 230 may be arranged to protrude from the printed circuit board 10 to the outside in a direction parallel to the other surface of the printed circuit board 10 (to the right in a left-right direction in FIG. 2B). The heat pipe 230 may be formed in a straight line shape.

The first heat transfer coin 210 may be formed on the one surface thereof with a heat-generating surface receiving groove 215 for accommodating the heat-generating surface of the heat-generating element 20. The heat-generating surface receiving groove 215 may accommodate a part of an end including the heat-generating surface of the heat-generating element 20. More specifically, the heat-generating surface of the heat-generating element 20 mounted on the other surface of the printed circuit board 10 to pass through the element mounting hole 15 may protrude to the other side of the printed circuit board 10 by a predetermined length, and in the state in which the one surface of the first heat transfer coin 210 comes into surface contact with the other surface of the printed circuit board 10, the protruding heat-generating surface of the heat-generating element 20 may be received and seated inside the heat-generating surface receiving groove 215 and may come into thermal contact with the heat-generating surface receiving groove 215.

Although not shown in the drawings, the heat transfer coins 210 and 220 may be surface-adhered to the other surface of the printed circuit board 10 by using a conductive adhesive. The conductive adhesive (not shown) may be made of a conductive material, and may improve the conduction performance of heat transferred from the printed circuit board 10 by bonding the other surface of the printed circuit board 10 and the heat transfer coins 210 and 220 to each other.

In particular, since the heat transfer coin 210 is coupled to the other surface of the printed circuit board 10 so as not to overlap in a horizontal direction, there is no need to separately groove the printed circuit board 10 in order to install the heat transfer coin 210 on the other surface of the printed circuit board 10, so that it is possible to reduce assembly man-hours and to shorten the manufacturing time of the printed circuit board 10.

The heat-generating surface of the heat-generating element 20 may be received and seated in the heat-generating surface receiving groove 215 of the heat transfer coin 210, and driving heat generated from the heat-generating element 20 may be directly transmitted to the heat transfer coin 210. The heat transferred to the heat transfer coin 210 may be dissipated through the heat pipe 230 described above, or may be directly transferred to a metal housing (not shown) and dissipated.

Referring to FIG. 3A, the printed circuit board 10 may include a plurality of sections S1 to S4 divided in a direction (left-right direction in FIG. 3A) parallel to the one surface of the printed circuit board 10 by a plating part that forms a circuit printed on the one surface of the printed circuit board 10. In the present embodiment, the plurality of sections S1 to S4 are separated from one another at equal intervals, but may not be necessarily have to be divided at equal intervals and may be divided at various intervals.

In the present embodiment, the plurality of sections S1 to S4 may be formed into four, but the number of the plurality of sections S1 to S4 is not limited to four and the printed circuit board 10 may be formed into at least two or more sections. Hereinafter, only an example in which the plurality of sections S1 to S4 are formed into four will be described.

The plurality of sections S1 to S4 may include a first section S1, a second section S2, a third section S3, and a fourth section S4.

The first section S1 may be arranged on the leftmost side of the printed circuit board 10. The first section S1 may be arranged on the left side of the second section S2 on the printed circuit board 10.

The second section S2 may be arranged on the right side of the first section S1 on the printed circuit board 10. The second section S2 may be arranged on the left side of the third section S3 on the printed circuit board 10. The second section S2 may be arranged between the first section S1 and the third section S3 on the printed circuit board 10.

The third section S3 may be arranged on the right side of the second section S2 on the printed circuit board 10. The third section S3 may be arranged on the left side of the fourth section S4 on the printed circuit board 10. The third section S3 may be arranged between the second section S2 and the fourth section S4 on the printed circuit board 10.

The fourth section S4 may be arranged on the right side of the third section S3 on the printed circuit board 10. The fourth section S4 may be arranged on the rightmost side of the printed circuit board 10.

The element mounting hole 15 may be formed as a plurality of element mounting holes 15. The plurality of element mounting holes 15 may be formed in the plurality of sections S1 to S4 one by one. That is, the plurality of element mounting holes 15 include a first element mounting hole 15A formed in the first section S1, a second element mounting hole 15B formed in the second section S2, a third element mounting hole 15C formed in the third section S3, and a fourth element mounting hole 15D formed in the fourth section S4.

The first heat-generating element 20 may be formed as a plurality of first heat-generating elements 20. The plurality of first heat-generating elements 20 may pass through the plurality of element mounting holes 15, respectively. That is, the plurality of first heat-generating elements 20 include a first-first heat-generating element 20A passing through the first element mounting hole 15A, a first-second heat-generating element 20B passing through the second element mounting hole 15B, a first-third heat-generating element 20C passing through the third element mounting hole 15C, and a first-fourth heat-generating element 20D passing through the fourth element mounting hole 15D.

The first heat transfer coin 210 may be formed as a plurality of first heat transfer coins 210. The heat-generating surface of each of the plurality of first heat-generating elements 20 may come into contact with one surface of each of the plurality of first heat transfer coins 210. That is, the plurality of first heat transfer coins 210 may include a first-first heat transfer coin 210A with which a heat-generating surface of the first-first heat-generating element 20A comes into contact, a first-second heat transfer coin 210B with which a heat-generating surface of the first-second heat-generating element 20B comes into contact, a first-third heat transfer coin 210C with which a heat-generating surface of the first-third heat-generating element 20C comes into contact, and a first-fourth heat transfer coin 210D with which a heat-generating surface of the first-fourth heat-generating element 20D comes into contact.

The heat-generating surface receiving groove 215 may be formed on the one surface of each of the plurality of first heat transfer coins 20. That is, the heat-generating surface receiving grooves 215 may include a first heat-generating surface receiving groove 215A formed in one surface of the first-first heat transfer coin 210A to receive the heat-generating surface of the first-first heat-generating element 20A, a second heat-generating surface receiving groove 215B formed in one surface of the first-second heat transfer coin 210B to receive the heat-generating surface of the first-second heat-generating element 20B, a third heat-generating surface receiving groove 215C formed in one surface of the first-third heat transfer coin 210C to receive the heat-generating surface of the first-third heat-generating element 20C, and a fourth heat-generating surface receiving groove 215D formed in one surface of the first-fourth heat transfer coin 210D to receive the heat-generating surface of the first-fourth heat-generating element 20D.

The second heat-generating element (not shown) may be formed as a plurality of second heat-generating elements. The plurality of second heat-generating elements may be installed on one surfaces of the plurality of sections S1 to S4 one by one. That is, the plurality of second heat-generating elements may include a second-first heat-generating element installed on the one surface of the first section S1, a second-second heat-generating element installed on the one surface of the second section S2, a second-third heat-generating element installed on the one surface of the third section S3, and a second-fourth heat-generating element installed on the one surface of the fourth section S4.

The second heat transfer coin 220 may be formed as a plurality of second heat transfer coins 220. That is, the plurality of second heat transfer coins 220 may include a second-first heat transfer coin 220A arranged on the opposite side of the second-first heat-generating element on the other surface of the printed circuit board 10, a second-second heat transfer coin 220B arranged on the opposite side of the second-second heat-generating element on the other surface of the printed circuit board 10, a second-third heat transfer coin 220C arranged on the opposite side of the second-third heat-generating element on the other surface of the printed circuit board 10, and a second-fourth heat transfer coin 220D arranged on the opposite side of the second-fourth heat-generating element on the other surface of the printed circuit board 10.

The heat pipe 230 may be provided as a plurality of heat pipes 230 being arranged in contact with the other surface of each of the plurality of first heat transfer coins 210 by one pair. That is, the plurality of heat pipes 230 may include a pair of a first-first heat pipes 230A arranged in contact with the other surface of the first-first heat transfer coin 210A, a pair of second heat pipes 230B arranged in contact with the other surface of the first-second heat transfer coin 210B, a pair of third heat pipes 230C arranged in contact with the other surface of the a first-third heat transfer coin 210C, and a pair of fourth heat pipes 230D arranged in contact with the other surface of the first-fourth heat transfer coin 210D.

When the electronic device 1 according to an embodiment of the present disclosure is implemented as an antenna device, the electronic device 1 may further include a shield cover 100 as shown in FIGS. 2A, 2B, 3A, and 3B. The shield cover 100 may prevent the leakage of signals generated from the signal-related heat-generating element 20 mounted on the printed circuit board 10.

The shield cover 100 may be provided with a grid-shaped shield cover wall 103 that forms a predetermined space C for accommodating at least one heat-generating element 20 on a surface facing the printed circuit board 10. The predetermined space C may be covered by the shield cover wall 103 and the one surface of the printed circuit board 10. Such a shield cover 100 may serve to prevent the leakage of signals so that there is no interference between the heat-generating element 20 within the predetermined space C and external signals.

The shield cover 100 may be formed with cover screw through holes 101 through which assembly screws (not shown) to be described below pass, the printed circuit board 10 may be formed with substrate screw through holes 11 so that the assembly screws having passed through the cover screw through holes 101 of the shield cover 100 sequentially pass through the substrate screw through holes 11, and at least the first heat transfer coin 210 of the heat transfer coins 210 and 220 may be formed with screw fastening holes 211 into which the assembly screws are fastened. When a metal housing 5 (see FIG. 8A) is provided as in an electronic device 1_a_ according to another embodiment to be described below, the assembly screws may be finally fastened to the metal housing 5.

The heat-generating surface of the heat-generating element 20 and the mutual bonding surface of the heat transfer coin 210 are closely adhered by the assembling force of the assembling screws, so that thermal contact resistance from the heat-generating element 20 to the heat transfer coin 210 can be minimized.

As described above, the electronic device 1 according to an embodiment of the present disclosure has an advantage capable of preventing deterioration of overall heat dissipation performance because it is not necessary to adopt a multi-layer printed circuit board 10 having a predetermined thickness (for example, 2.5 mm) or more for installation of at least the heat transfer coins 210 and 220 in the heat dissipation unit 200 and it is possible to adopt a printed circuit board 10 having a predetermined small thickness (for example, 1.6 mm) or less that facilitates heat transfer to both sides.

Moreover, since it is not necessary to install the heat transfer coins 210 and 220 of the heat dissipation unit 200 in an embedded form on the printed circuit board 10 and the heat transfer coins 210 and 220 can be easily attached using a conductive adhesive even without grooving the other surface of the printed circuit board 10, the electronic device 1 has an advantage capable of shortening the assembly time of an entire product.

Figure 8A:
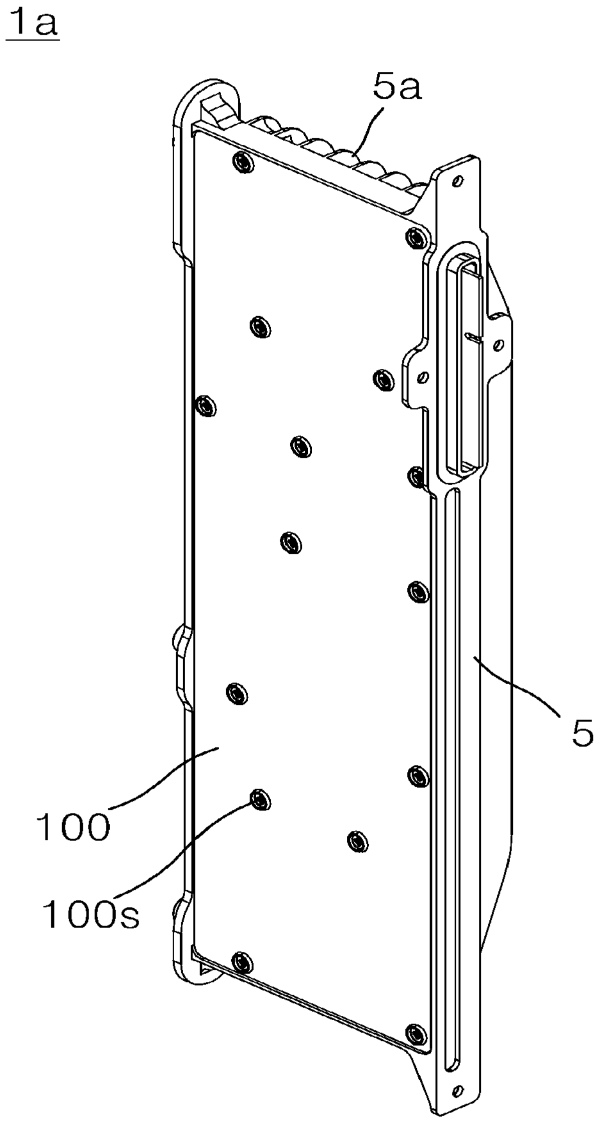
FIGS. 8A and 8B are perspective views showing an electronic device according to another embodiment of the present disclosure.
Figure 8B:
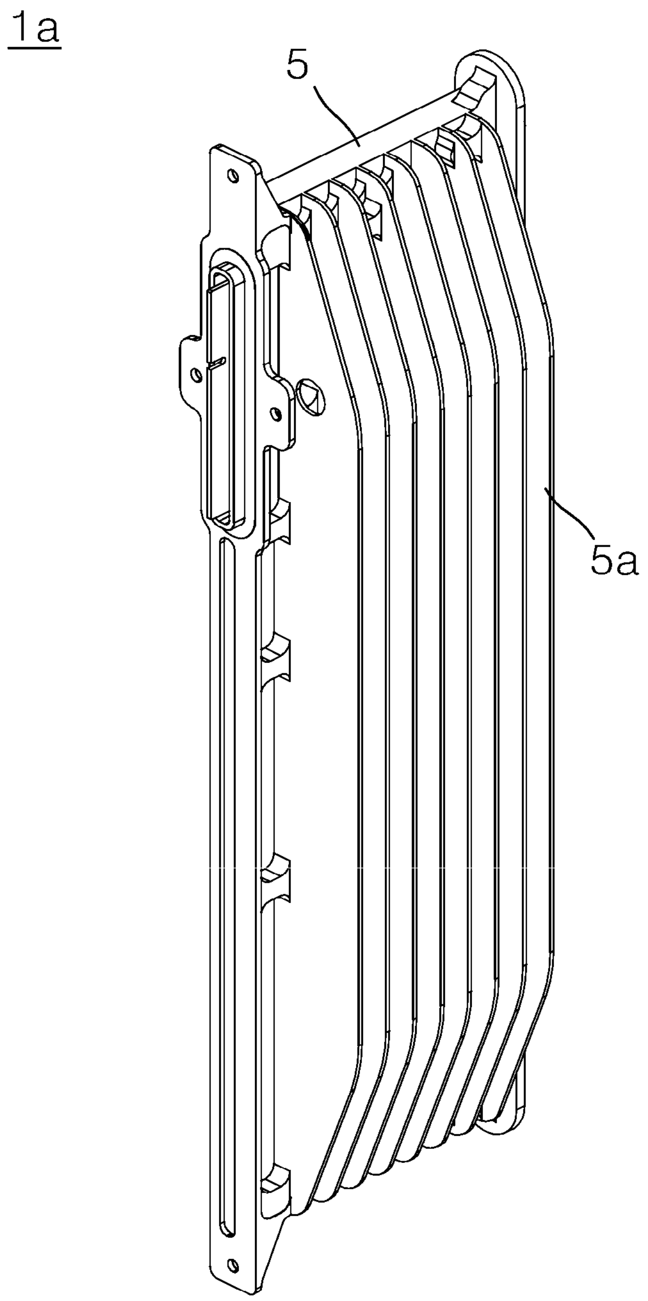
Figure 9B:
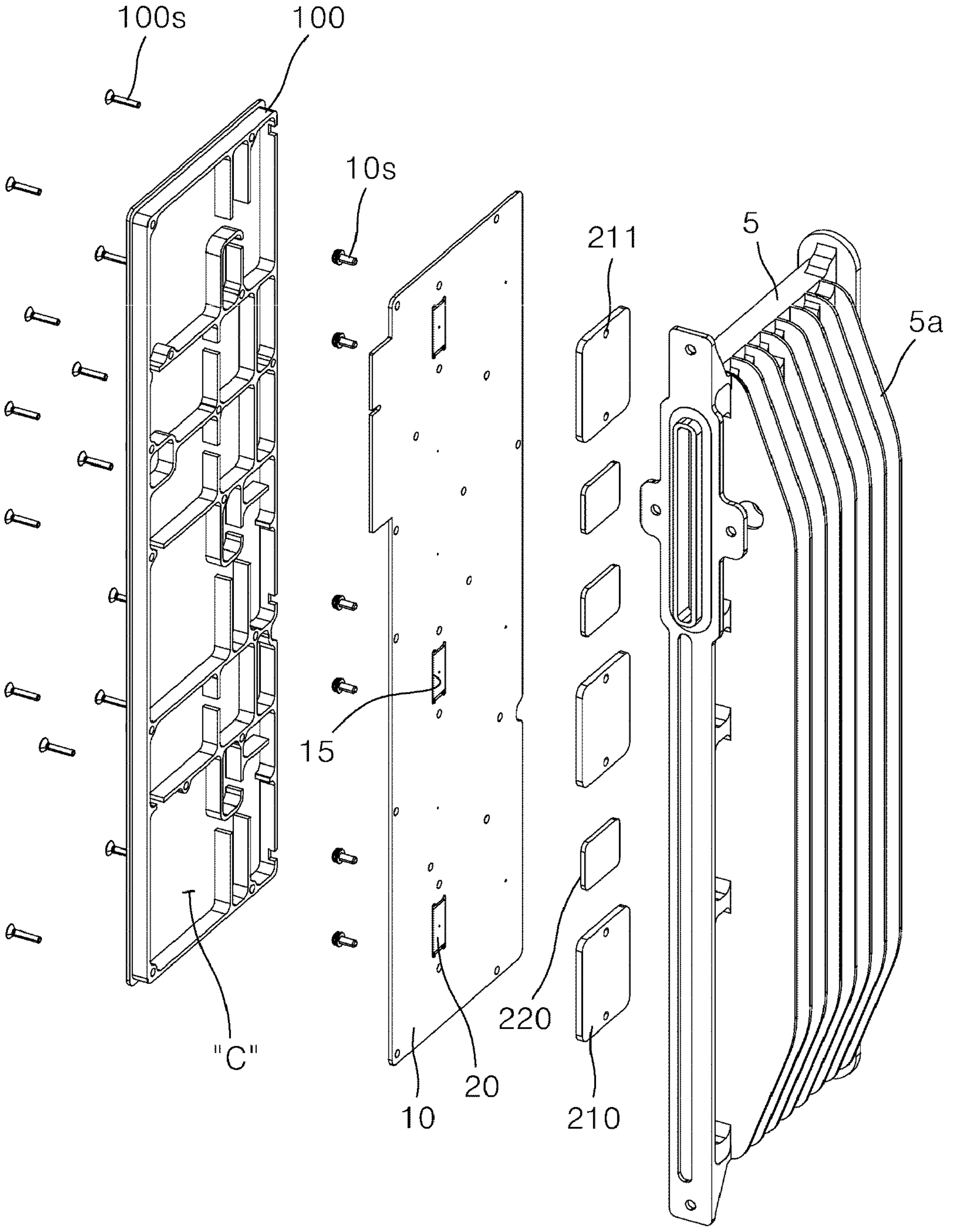
Figure 10:
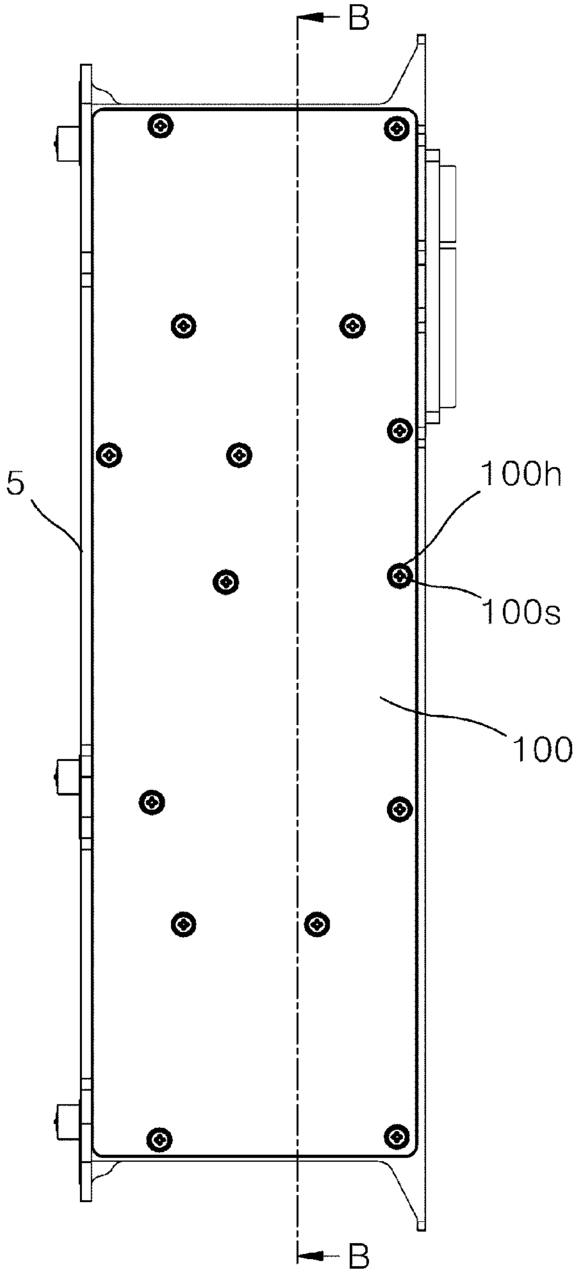
FIG. 10 is a plan view of FIGS. 8A and 8B.
Figure 11:
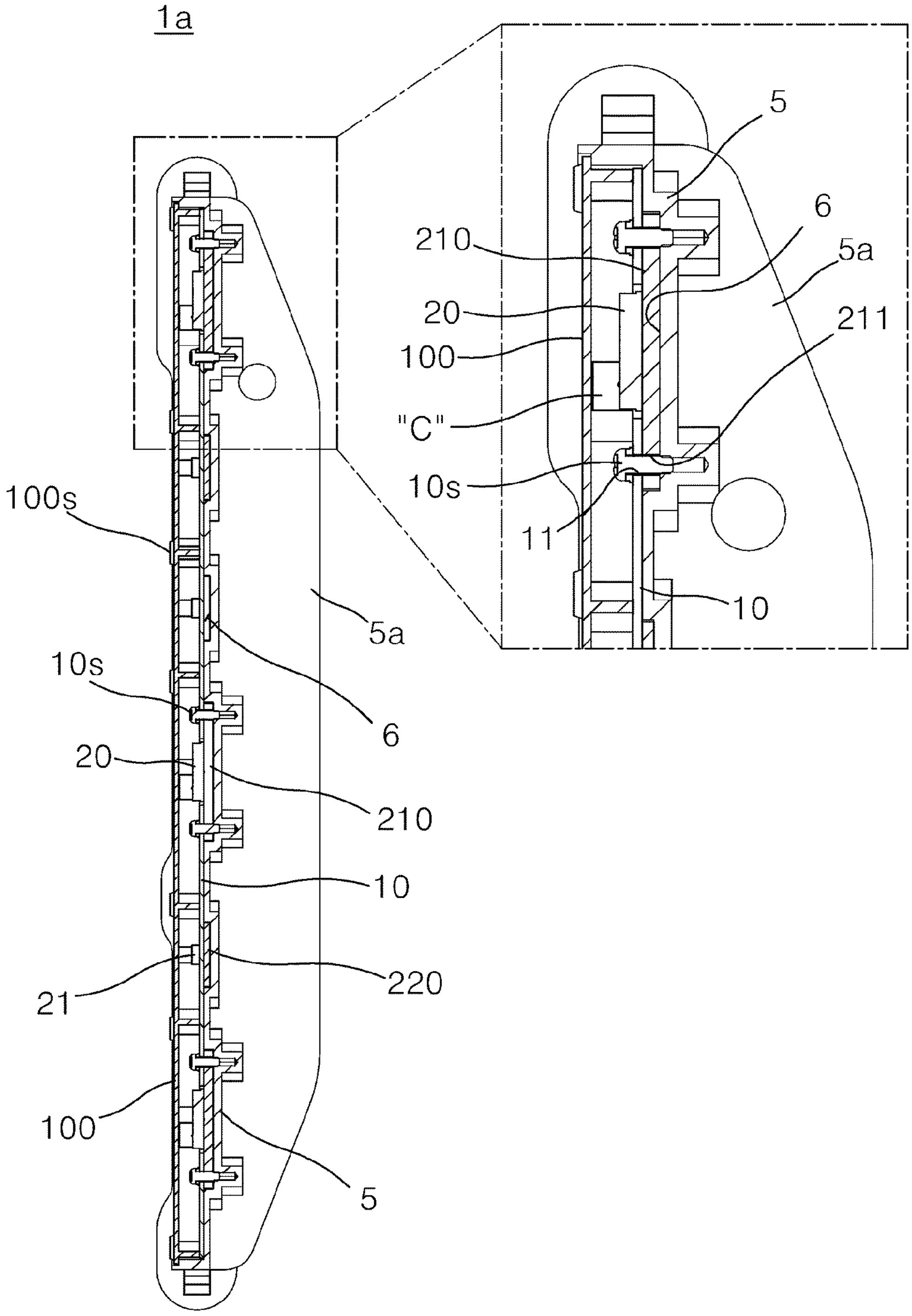
FIG. 11 is a cross-sectional view taken along line B-B in FIG. 10.
Figure 12:
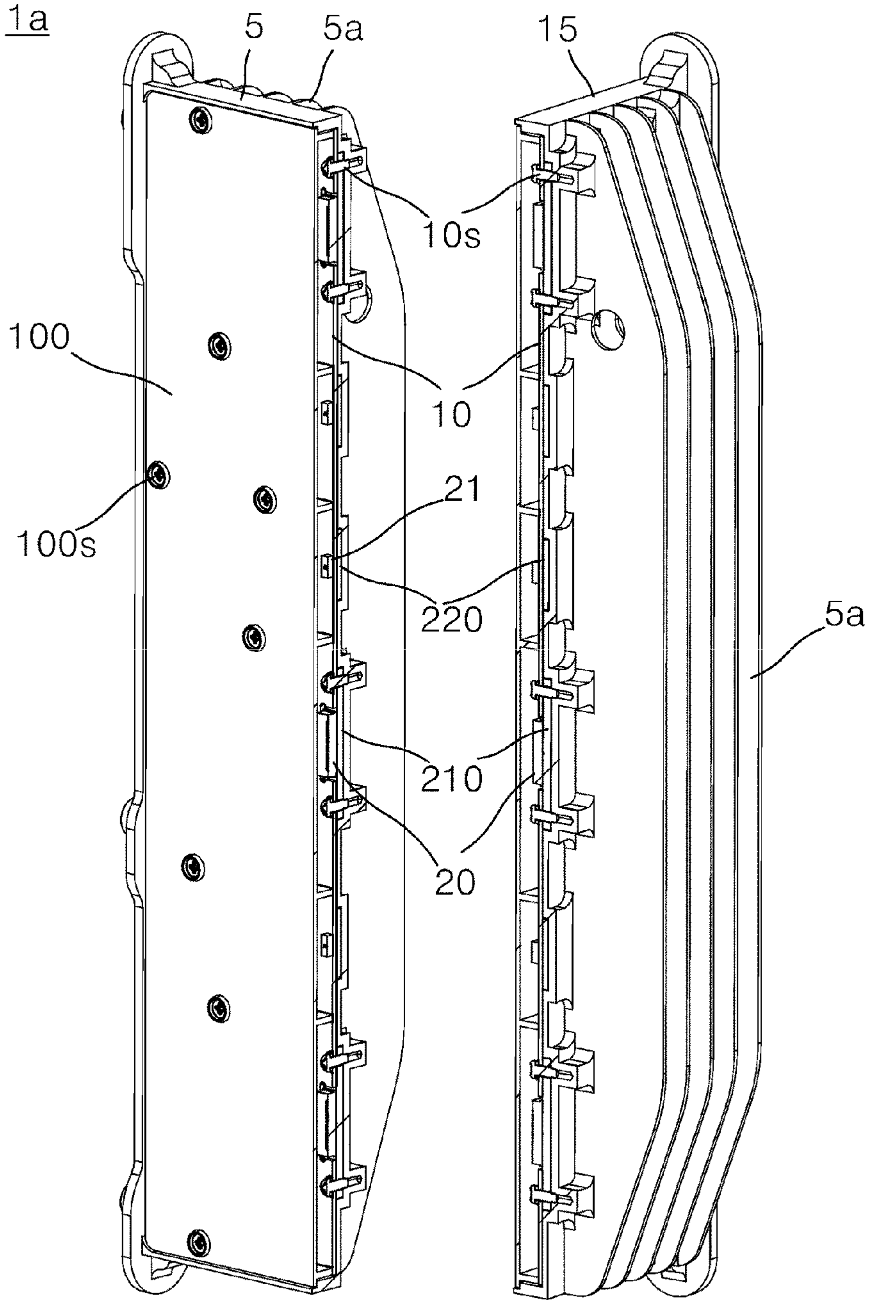
FIG. 12 is a cut-away perspective view taken along line B-B in FIG. 10.

FIGS. 8A and 8B are perspective views showing an electronic device according to another embodiment of the present disclosure, FIGS. 9A and 9B are exploded perspective views of FIGS. 8A and 8B, respectively, FIG. 10 is a plan view of FIGS. 8A and 8B, FIG. 11 is a cross-sectional view taken along line B-B in FIG. 10, and FIG. 12 is a cut-away perspective view taken along line B-B in FIG. 10.

As shown in FIGS. 8A, 8B, 9A, 9B, 10, 11, and 12, the electronic device 1_a_ according to another embodiment of the present disclosure may include the metal housing 5 having an installation space 5_s_ therein.

The metal housing 5 is made of a metal material with excellent heat conduction, and a plurality of heat sink fins 5_a_ may be integrally formed on the rear surface side of the metal housing 5. The plurality of heat sink fins 5_a_ may be formed such that a plurality of fins long in a vertical direction may be spaced apart from one another in a left-right direction.

On the inner surface of the installation space 5_s_ (see FIG. 9A) of the metal housing 5 may be formed with seating grooves 6 (see FIG. 11) into which heat transfer coins 210 and 220 to be described below are completely inserted.

The electronic device 1_a_ according to another embodiment of the present disclosure may further include a printed circuit board 10 stacked on the inner surface of the installation space 5_s_ of the metal housing 5 and formed with an element mounting hole 15 passing through in a front-rear direction.

Since the mounting form of the heat-generating elements 20 and 21 (in particular, the first heat-generating element 20), which will be described below, to the element mounting hole 15 is the same as in the case of the electronic device 1 according to an embodiment of the present disclosure described above, detailed description thereof will be omitted. However, out of the heat-generating elements 20 and 21 to be described below, the second heat-generating element 21 is an electrical component with a relatively low amount of heat generation (for example, in the case of a signal-related component of an antenna device, an Rx element (LNA) may correspond to the electrical component), and may be directly mounted on the front surface of the printed circuit board 10 without providing the element mounting hole 15.

As shown in FIG. 9A, the electronic device 1_a_ according to another embodiment of the present disclosure may include at least one heat-generating element 20 (hereinafter, referred to as 'first heat-generating element 20') mounted on one surface of the printed circuit board 10 so that a heat-generating surface thereof passes through the element mounting hole 15 of the printed circuit board 10 and is exposed to the other surface side of the printed circuit board 10. The electronic device 1_a_ according to another embodiment of the present disclosure may further include the second heat-generating element 21 directly mounted on the front surface of the printed circuit board 10 without providing the element mounting hole 15, unlike the first heat-generating element 20.

When the electronic device 1_a_ according to another embodiment of the present disclosure is implemented as an antenna device, the first heat-generating element 20 may be a Tx element (Tr, Da element) with a relatively large amount of heat generation among signal-related components, and the second heat-generating element 21 may be an Rx element (LNA element) with a relatively small amount of heat generation among the signal-related components.

Preferably, the heat-generating surface of the first heat-generating element 20 passes through the element mounting hole 15 and is exposed to the other surface of the printed circuit board 10, and the heat-generating surface of the first heat-generating element 20 and the other surface of the printed circuit board 10 form the same surface.

The electronic device 1*a* according to another embodiment of the present disclosure may further include the heat transfer coins 210 and 220 coupled to the other surface of the printed circuit board 10 and coupled in surface thermal contact with the exposed heat-generating surface of the first heat-generating element 20.

The heat transfer coins 210 and 220 may include a first heat transfer coin 210 provided corresponding to a position of the first heat-generating element 20 to receive heat from the first heat-generating element 20, and a second heat transfer coin 220 provided corresponding to a position of the second heat-generating element 21 to receive heat from the second heat-generating element 21.

The first heat transfer coin 210 may be arranged to be in direct surface thermal contact with the heat-generating surface of the first heat-generating element 20, while the second heat transfer coin 220 is not in direct surface thermal contact with the second heat-generating element 21, but may be adhered to the other surface of the printed circuit board 10, corresponding to the opposite surface of the first heat-generating element 20 on which the first heat transfer coin 210 is mounted, by using the conductive adhesive described above. The first heat transfer coin 210 and the second heat transfer coin 220 may each made of copper or brass among metal materials with excellent heat conduction, as described in the electronic device 1 according to an embodiment of the present disclosure described above.

The electronic device 1*a* according to another embodiment of the present disclosure may further include a shield cover 100 coupled to the front end of the metal housing 5 to cover one surface of the printed circuit board 10, as shown in FIGS. 8A, 8B, 9A, 9B, 10, 11, and 12.

As in the embodiment already described above, the shield cover 100 may be provided with a shield cover wall (not indicated by reference numeral) formed on the rear surface thereof, may be provided with a predetermined space C for accommodating the first heat-generating element 20 and the second heat-generating element 21 between the shield cover 100 and the front surface of the printed circuit board 10, and may serve to prevent the leakage of internal signals on the predetermined space C.

One surface of the metal housing 5 facing the other surface of the printed circuit board 10 may be open, the printed circuit board 10 may be inserted into the installation space 5*s* of the metal housing 5 through the opened one surface of the metal housing 5, and the shield cover 100 may cover the opened one surface of the metal housing 5 after the printed circuit board 10 is inserted into the installation space 5*s* of the metal housing 5.

The printed circuit board 10 may be formed with a board screw through hole 11 through which at least one board assembly screw 10*s* passes, and the metal housing 5 may be formed with a board screw fastening hole 5*h* into which the board assembly screw 10*s* is fastened by passing through the printed circuit board 10.

The shield cover 100 may be formed with a cover screw through hole 100*h* through which at least one cover assembly screw 100*s* passes, and the cover assembly screw 100*s* may be fastened into a cover screw fastening hole 5*h*' formed in the metal housing 5 by passing through the cover screw through hole 100*h* of the shield cover 100 and the printed circuit board 10, so that the shield cover 100 may be installed on the metal housing 5.

The heat transfer coins 210 and 220 may be closely coupled to the other surface of the printed circuit board 10 by the board assembly screw 10*s* fastened into the board screw fastening hole 5*h* provided on the inner surface of the metal housing 5 by passing through the printed circuit board 10.

As described above, the electronic device 1*a* according to another embodiment of the present disclosure is different from the embodiment described above in that the metal housing 5 is further provided, but since it is not necessary to adopt the printed circuit board 10 having a predetermined thickness (2.5 mm) or more in order to install the first heat transfer coin 210 and the second heat transfer coin 220 of the heat dissipation unit 200 on the printed circuit board 10 and separate groove processing is not necessary, assembly time can be shortened, and a small thickness (for example, 1.6 mm) can be adopted, thereby providing an advantage of improving heat dissipation performance on both sides of the printed circuit board 10.

Above, embodiments of the electronic device according to the present disclosure have been described in detail with reference to the attached drawings. However, embodiments of the present disclosure are not necessarily limited to the above-described embodiments, and it is natural that various modifications and implementations in an equivalent range can be made by those skilled in the art. Accordingly, the true scope of the present disclosure will be determined by the claims to be described below.

INDUSTRIAL APPLICABILITY

The present disclosure provides an electronic device capable of removing limitations in a thickness of a printed circuit board by removing a process of inserting a heat transfer coin into the printed circuit board, and improving heat dissipation performance.

The invention claimed is:

1. An electronic device comprising:

a printed circuit board including a heat-generating element arranged on one surface of the printed circuit board; and a heat transfer coin provided such that one surface of the heat transfer coin comes into contact with a portion of the other surface of the printed circuit board, opposite to the heat-generating element, so as to dissipate heat generated from the heat-generating element, wherein the printed circuit board is formed with an element mounting hole through which the heat-generating element passes, wherein the heat transfer coin covers the element mounting hole, the one surface being in contact with a heat-generating surface of the heat-generating element, and wherein the heat transfer coin is formed with a heat-generating surface receiving groove for accommodating a part of an end including the heat-generating surface of the heat-generating element.

2. The electronic device of claim 1, wherein the heat transfer coin is made of copper or brass.

3. The electronic device of claim 1, further comprising:

a heat pipe having a straight line shape and including one end in contact with the other surface of the heat transfer coin and the other end protruding outward in a direction parallel to the other surface of the printed circuit board.

4. The electronic device of claim 1, wherein the heat transfer coin is surface-adhered to the other surface of the printed circuit board by using a conductive adhesive.

5. The electronic device of claim 1, wherein the heat transfer coin is closely coupled to the other surface of the printed circuit board by using an assembly screw passing through the printed circuit board.

6. The electronic device of claim 1, further comprising:

a shield cover that covers the one surface of the printed circuit board to prevent leakage of signals generated from the heat-generating element, wherein the heat transfer coin is closely coupled to the other surface of the printed circuit board by using an assembly screw passing through the shield cover and the printed circuit board.

7. The electronic device of claim 1, wherein the printed circuit board is formed in a multilayer and has a thickness of 1.6 mm or less.

8. The electronic device of claim 1, wherein the printed circuit board includes a plurality of sections divided in a direction parallel to the one surface of the printed circuit board by a plating part that forms a circuit printed on the one surface of the printed circuit board, the element mounting hole is formed in the plurality of sections one by one to be formed as a plurality of element mounting holes, the heat-generating element is formed as a plurality of heat-generating elements passing through the plurality of element mounting holes, respectively, and the heat transfer coin is formed as a plurality of heat transfer coins each having one surface with which a heat-generating surface of each of the plurality of heat-generating elements comes into contact.

9. An electronic device comprising:

a metal housing having an installation space therein;

a printed circuit board stacked on an inner surface of the metal housing and including a heat-generating element arranged on one surface of the printed circuit board; and a heat transfer coin provided such that one surface of the heat transfer coin comes into contact with a portion of the other surface of the printed circuit board, opposite to the heat-generating element, so as to dissipate heat generated from the heat-generating element, wherein the printed circuit board is formed with an element mounting hole through which the heat-generating element passes, wherein the heat transfer coin covers the element mounting hole, the one surface being in contact with a heat-generating surface of the heat-generating element, and wherein the heat transfer coin is formed with a heat-generating surface receiving groove for accommodating a part of an end including the heat-generating surface of the heat-generating element.

10. The electronic device of claim 9, wherein an inner surface of the metal housing is formed with a seating groove into which the heat transfer coin is completely inserted.

11. The electronic device of claim 9, wherein the heat transfer coin is closely coupled to the other surface of the printed circuit board by a board assembly screw fastened to a board screw fastening hole provided on an inner surface of the metal housing by passing through the printed circuit board.

* * * * *